United States Patent
Joshi et al.

(10) Patent No.: US 9,768,273 B2
(45) Date of Patent: Sep. 19, 2017

(54) METHOD OF FORMING A TRENCH USING EPITAXIAL LATERAL OVERGROWTH

(71) Applicant: Infineon Technologies Austria AG, Villach (AT)

(72) Inventors: Ravi Joshi, Villach (AT); Johannes Baumgartl, Riegersdorf (AT); Martin Poelzl, Ossiach (AT); Matthias Kuenle, Villach-Landskron (AT); Juergen Steinbrenner, Noetsch (AT); Andreas Haghofer, Villach (AT); Christoph Gruber, Wenberg (AT); Georg Ehrentraut, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/187,232

(22) Filed: Jun. 20, 2016

(65) Prior Publication Data

US 2016/0308028 A1    Oct. 20, 2016

Related U.S. Application Data

(62) Division of application No. 14/174,185, filed on Feb. 6, 2014, now Pat. No. 9,379,196.

(51) Int. Cl.
*H01L 29/66* (2006.01)
*H01L 21/02* (2006.01)
(Continued)

(52) U.S. Cl.
CPC .. *H01L 29/66613* (2013.01); *H01L 21/02233* (2013.01); *H01L 21/02647* (2013.01); *H01L 21/3086* (2013.01); *H01L 21/30604* (2013.01); *H01L 21/31111* (2013.01); *H01L 21/31144* (2013.01); *H01L 29/4236* (2013.01); *H01L 29/66666* (2013.01); *H01L 29/78* (2013.01); *H01L 29/7827* (2013.01)

(58) Field of Classification Search
CPC ........... H01L 21/02639; H01L 21/0254; H01L 21/0262; H01L 21/02647; H01L 21/02381
See application file for complete search history.

(56) References Cited

U.S. PATENT DOCUMENTS

| 8,253,211 B2 | 8/2012 | Cheng et al. |
| 2006/0084245 A1* | 4/2006 | Kohda ................ H01L 21/0237 438/478 |
| 2013/0181284 A1 | 7/2013 | Poelzl |

FOREIGN PATENT DOCUMENTS

DE     102005020075 A1   11/2006

* cited by examiner

*Primary Examiner* — Quoc Hoang
(74) *Attorney, Agent, or Firm* — Murphy, Bilak & Homiller, PLLC

(57) ABSTRACT

In one aspect, a method of forming a trench in a semiconductor material includes forming a first dielectric layer on a semiconductor substrate. The first dielectric layer includes first openings. An epitaxial layer is grown on the semiconductor substrate by an epitaxial lateral overgrowth process. The first openings are filled by the epitaxial layer and the epitaxial layer is grown onto adjacent portions of the first dielectric layer so that part of the first dielectric layer is uncovered by the epitaxial layer and a gap forms between opposing sidewalls of the epitaxial layer over the part of the first dielectric layer that is uncovered by the epitaxial layer. The gap defines a first trench in the epitaxial layer that extends to the first dielectric layer.

20 Claims, 16 Drawing Sheets

(51) Int. Cl.
*H01L 21/306* (2006.01)
*H01L 21/311* (2006.01)
*H01L 29/423* (2006.01)
*H01L 29/78* (2006.01)
*H01L 21/308* (2006.01)

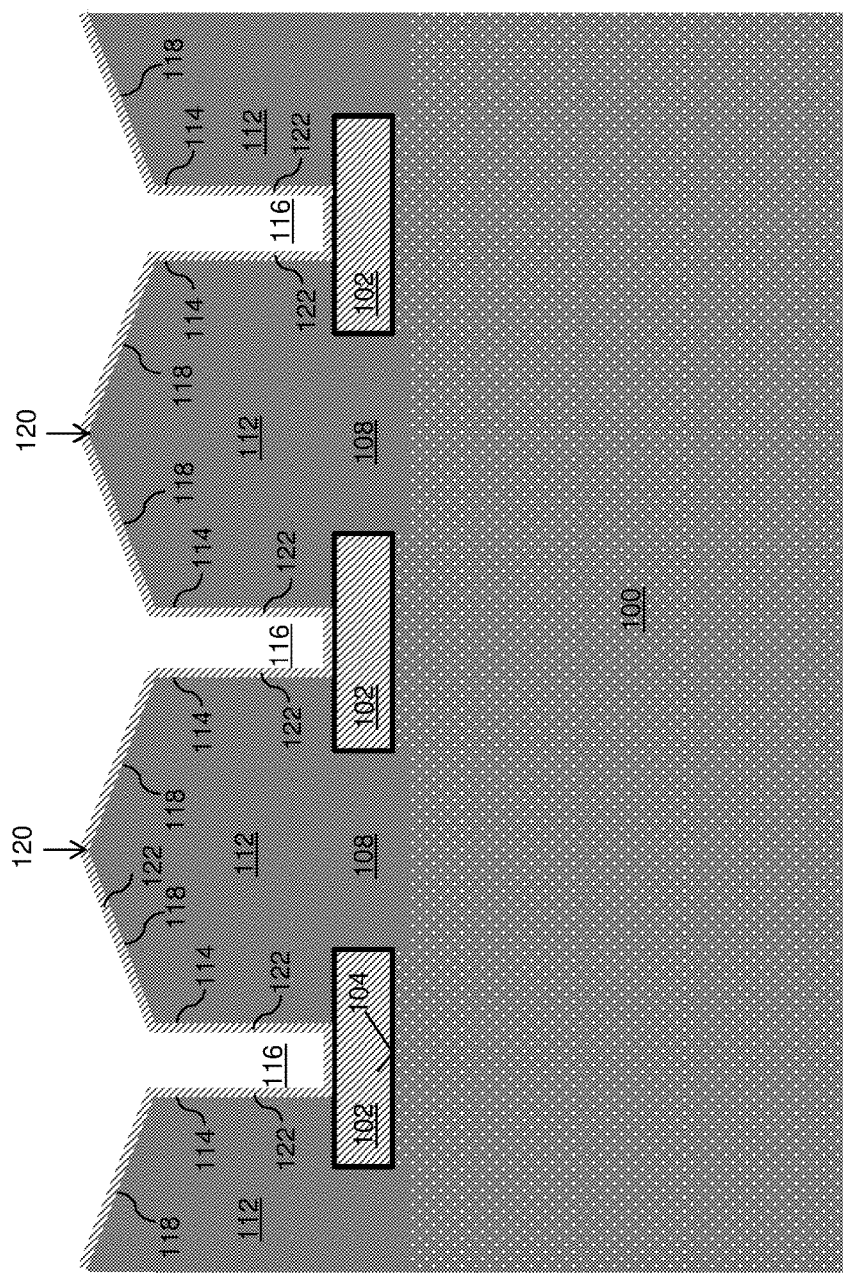

METHOD OF FORMING A TRENCH USING EPITAXIAL LATERAL OVERGROWTH

TECHNICAL FIELD

The present invention generally relates to methods of forming trench structures in semiconductor materials and corresponding trench structures, and more particularly relates to using an epitaxial lateral overgrowth process to form deep vertical trenches.

BACKGROUND

The semiconductor industry is constantly seeking ways to reduce the dimensions of semiconductor devices, such as metal-oxide-semiconductor field-effect transistors (MOSFETs). Modern semiconductor processing technologies are typically defined by the minimum feature size (e.g. channel width) of the devices. Smaller feature sizes provide faster switching speeds and allow for more semiconductor devices to be produced in a smaller area, thus reducing production costs.

The need to reduce device dimensions correspondingly leads to a need to manufacture smaller scale trenches in semiconductors. Many semiconductor devices utilize a trench design. For example, a gate electrode of a transistor may be provided in a trench, beneath a surface of a semiconductor material. The benefits of this trench design may include increased current-carrying capacity and increased reverse voltage blocking capability, which may be particularly advantageous in high power applications. Additionally, trenches are commonly used to provide electrical contacts to device regions, such as a source or body contact.

Narrow and high aspect ratio trenches enable the manufacture of smaller, higher performance devices and enable further scaling of processing technologies. Leading-edge technologies may require trench widths as narrow as a few tens of nanometers. These dimensions may be beyond the resolution of modern photolithography techniques, or may only be possible at reduced yield. Additional challenges arise if a device design requires two differently dimensioned trenches spaced close to one another (e.g. a gate trench arranged next to a source contact trench). Conventional lithography can only achieve these differently dimensioned trenches by separate masking and etching steps for each trench, which increases cost and reduces yield.

SUMMARY

According to one embodiment, a method of forming a trench in a semiconductor material is provided. The method includes forming a first dielectric layer on a semiconductor substrate. The first dielectric layer includes first openings. An epitaxial layer is grown on the semiconductor substrate by an epitaxial lateral overgrowth process. The first openings are filled by the epitaxial layer and the epitaxial layer is grown onto adjacent portions of the first dielectric layer so that part of the first dielectric layer is uncovered by the epitaxial layer and a gap forms between opposing sidewalls of the epitaxial layer over the part of the first dielectric layer that is uncovered by the epitaxial layer. The gap defines a first trench in the epitaxial layer that extends to the first dielectric layer.

According to another embodiment, a semiconductor device is provided. The semiconductor device includes a semiconductor substrate having a first surface. A first dielectric layer is arranged on the first surface and includes first openings. An epitaxial layer fills the first openings and extends onto adjacent portions of the first dielectric layer so that part of the first dielectric layer is uncovered by the epitaxial layer and a gap between opposing sidewalls of the epitaxial layer is over the part of the first dielectric layer that is uncovered by the epitaxial layer. The gap defines a first trench in the epitaxial layer that extends to the dielectric layer.

According to another embodiment, a semiconductor device includes a semiconductor substrate having a first surface. A deep vertical trench is formed in the semiconductor substrate and includes sidewalls extending from the first surface to a bottom side that is spaced apart from the first surface. The trench has a depth that is measured by a distance from the first surface to the bottom side and a width that is measured by a minimum separation distance between the trench sidewalls. The width of the trench is less than or equal to 100 nanometers. An aspect ratio of the trench that is determined by the ratio of the length to the width is at least 10:1.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A-5B depict forming a second dielectric layer in the trench and forming a conductive electrode in the trench that is insulated from adjacent semiconductor material, according to an embodiment.

DETAILED DESCRIPTION

Embodiments described herein provide a deep vertical trench structure in a semiconductor material and method of forming the deep vertical trench using epitaxial lateral overgrowth. According to the method, a trench is produced in a semiconductor material by epitaxial lateral overgrowth. A dielectric layer is formed on a semiconductor substrate and openings are formed in the dielectric layer. An epitaxial layer is grown on the semiconductor substrate so that the openings are filled by the epitaxial layer. As the epitaxial layer grows out of the openings away from the substrate, it also grows over portions of the dielectric layer adjacent to the openings. However, the process parameters are controlled so that the epitaxial layer does not completely extend over these portions of the dielectric layer. In other words, portions of the dielectric layer are used to restrict the growth of the epitaxial layer so that a gap having opposing sidewalls remains in the epitaxial layer. This gap defines a trench in the epitaxial layer. This trench may be used to form device trenches, such as gate electrode trenches and source contact trenches.

According to one embodiment, the trench formed in the epitaxial layer is filled with a conductive electrode to form an active device in the epitaxial layer. Alternatively, the trench in the epitaxial layer may be used to define openings in the dielectric layer, which in turn are used to define trenches in the semiconductor substrate. The resulting trenches may be used to form active devices in the semiconductor substrate. Both embodiments allow for the formation of two self-aligned trenches of variable thickness and depth. These two self-aligned trenches may be used as gate trenches and contact trenches, for example. The presently disclosed methods offer several advantages over conventional lithography techniques. Likewise, the trenches produced from the presently disclosed methods offer several advantages over trenches formed from conventional lithography techniques. For instance, reduced trench widths, higher aspect ratios, reduced manufacturing costs and smoother trench sidewall surfaces are attainable.

Figure 1A:
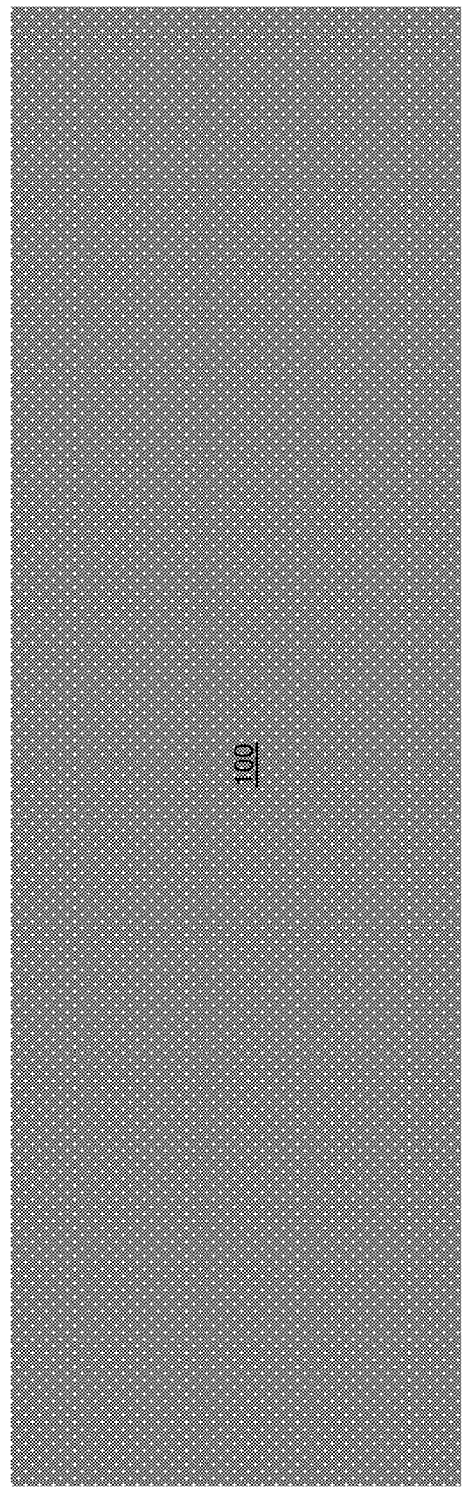
FIGS. 1A-1B depict forming a first dielectric layer on a semiconductor substrate by oxidizing the substrate, according to an embodiment.

Referring to FIG. 1, a semiconductor substrate 100 is provided and a first dielectric layer 102 is formed on the semiconductor substrate 100. The semiconductor substrate 100 depicted in FIG. 1A can be made of any material suitable for manufacturing a semiconductor device and growing an epitaxial layer. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. According to an embodiment, the semiconductor substrate 100 is made from a monocrystalline Silicon (Si) material.

Figure 1B:
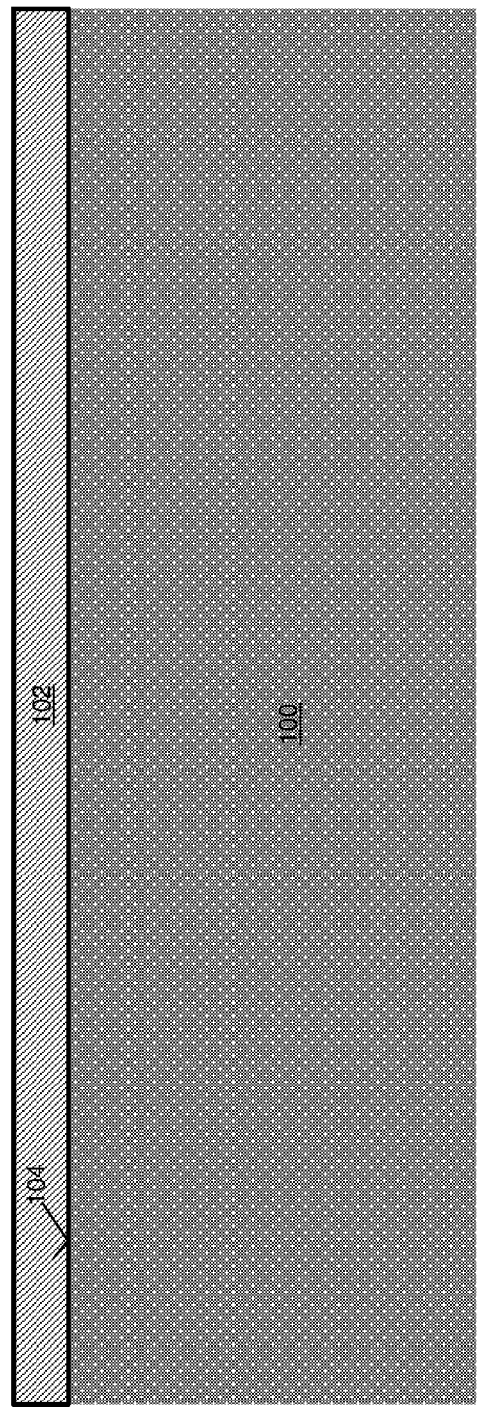

As shown in FIG. 1B, a first dielectric layer 102 is formed on the semiconductor substrate 100. The first dielectric layer 102 may be formed according to commonly used practices. For instance, the first dielectric layer 102 may be formed by an oxidation process in which a silicon semiconductor substrate 100 may be placed in an oven having an oxygen atmosphere and heated to temperatures sufficient to form a layer of silicon dioxide ($SiO_2$) on the substrate 100. An interface between the first dielectric layer 102 and the semiconductor substrate 100 defines a first surface 104 of the semiconductor substrate 100.

Figure 2A:
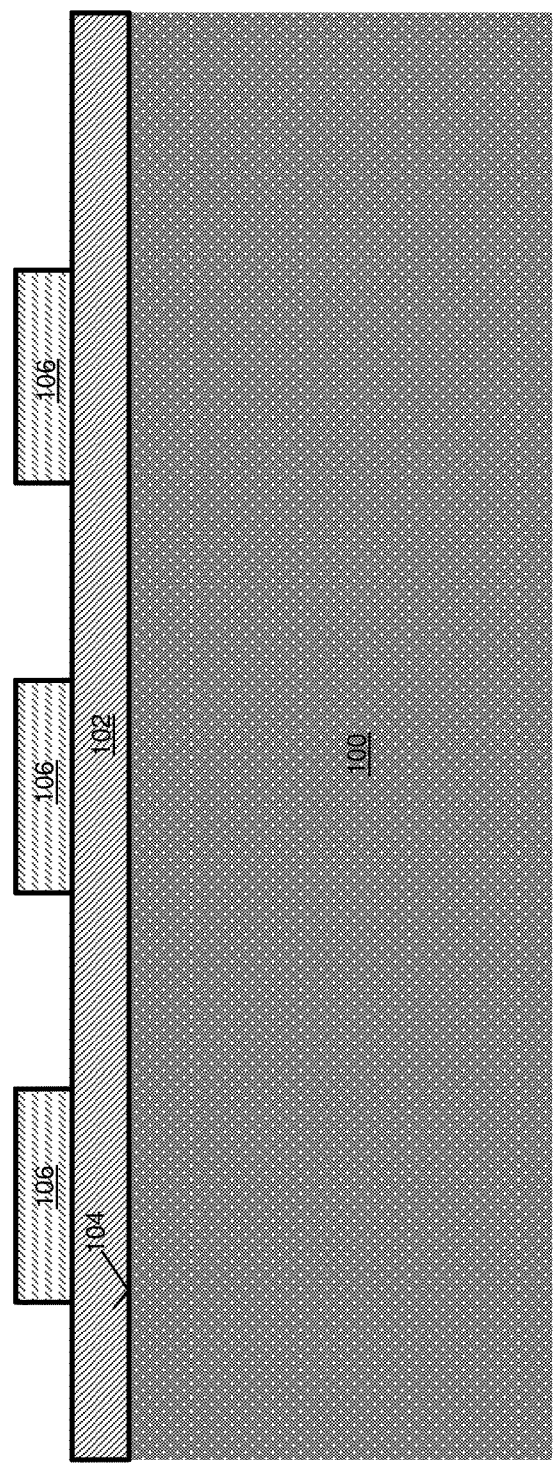
FIGS. 2A-2B depict forming the first openings in the first dielectric layer by masking and etching, according to an embodiment.
Figure 2B:
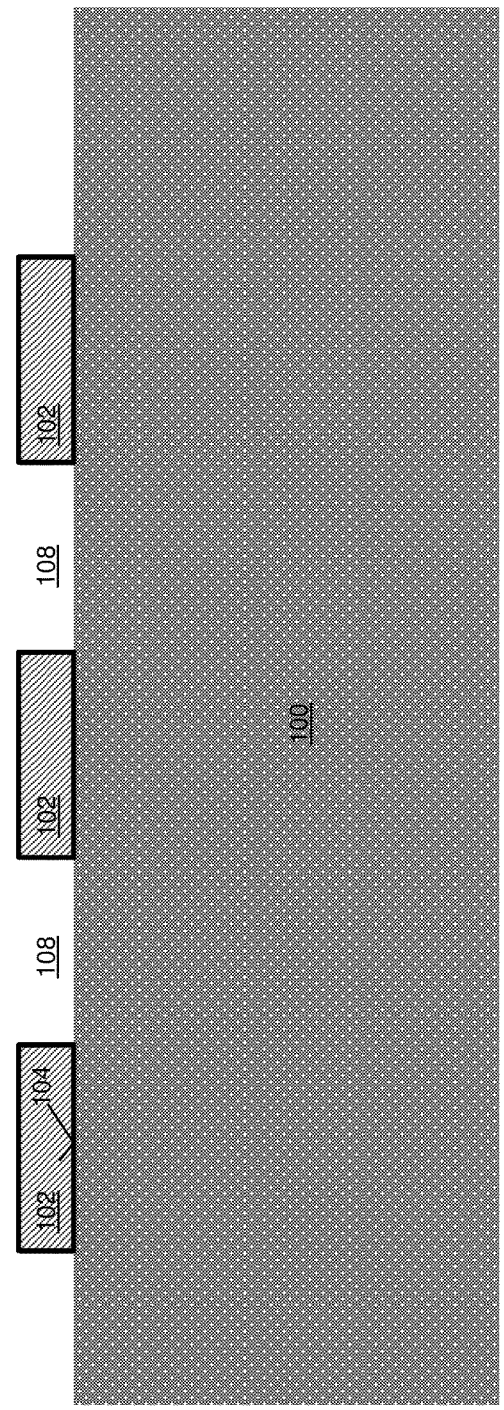

Referring to FIG. 2, a lithography mask 106 is provided over the first dielectric layer 102 and first openings 108 are formed in the dielectric layer 102. The first openings 108 may be formed by a sequence of masking and etching. As shown in FIG. 2A, the lithography mask 106 is patterned to expose portions of the first dielectric layer 102 corresponding to the desired location of the first openings 108. As shown in FIG. 2B, the exposed portions of the first dielectric layer 102 are removed and the lithography mask 106 is removed. The exposed portions of the first dielectric layer may be removed by commonly used methods, such as dry or wet (chemical) etching.

Figure 3A:
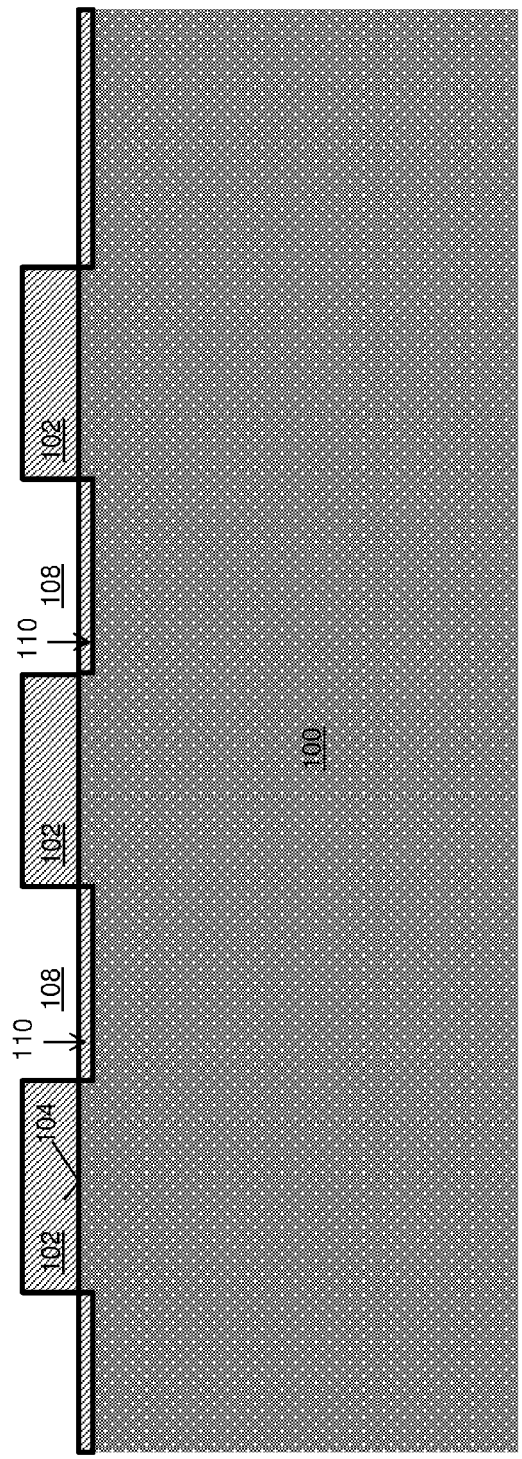
FIGS. 3A-3B depict a sequence of improving the surface of the semiconductor substrate in the first openings for subsequent growth of an epitaxial layer by re-oxidizing and etching the semiconductor surface, according to an embodiment.
Figure 3B:
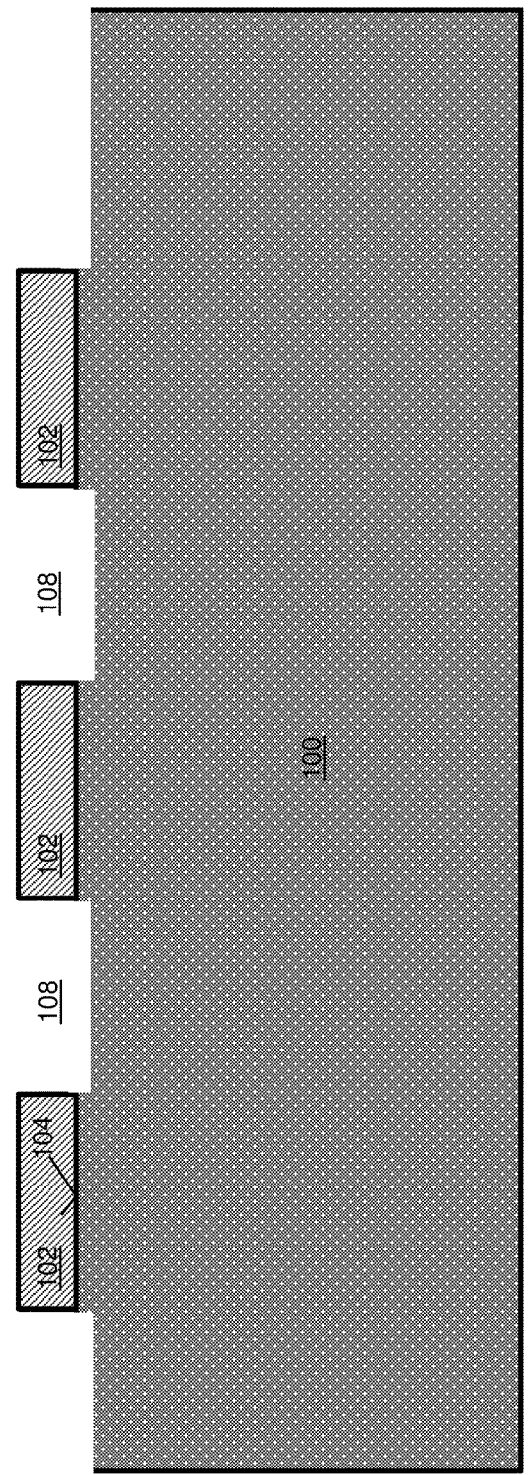

FIG. 3 including FIGS. 3A and 3B depicts a sequence that may be performed after the sequence shown in FIGS. 1-2 to optimize the semiconductor material for subsequent growth of an epitaxial layer. The preceding sequence depicted in FIGS. 1-2 may result in an uneven or damaged crystal structure at the exposed surface of the semiconductor substrate 100 in the first openings 108. For example, if the first openings 108 are formed by a plasma etching process, the crystal structure of the semiconductor substrate 100 may be damaged or defective. This damaged surface may not be conducive to the growth of epitaxy. For instance, an epitaxial layer grown on this surface may be uneven or may grow as a polycrystalline structure.

As shown in FIG. 3A, after the first openings 108 are etched, the semiconductor substrate is re-oxidized to form oxide regions 110 in the first openings 108. The re-oxidation process may be an identical or similar process to the process used to form the first dielectric layer 102 in which the device is exposed to an oxygen atmosphere at high temperatures. As shown in FIG. 3B, the oxide regions 110 are removed so that the semiconductor substrate 100 is exposed in the first openings 108. The oxide regions 110 may be removed by an etching process, such as a wet (chemical) etch. As a result, the first openings 108 extend further into the semiconductor substrate 100. That is, the re-oxidation and etching process removes semiconductor material from the semiconductor substrate 100 beyond the first surface 104. Advantageously, this removes most or all of any damaged crystalline surfaces that may result from the sequence depicted in FIGS. 1-2.

Figure 4:
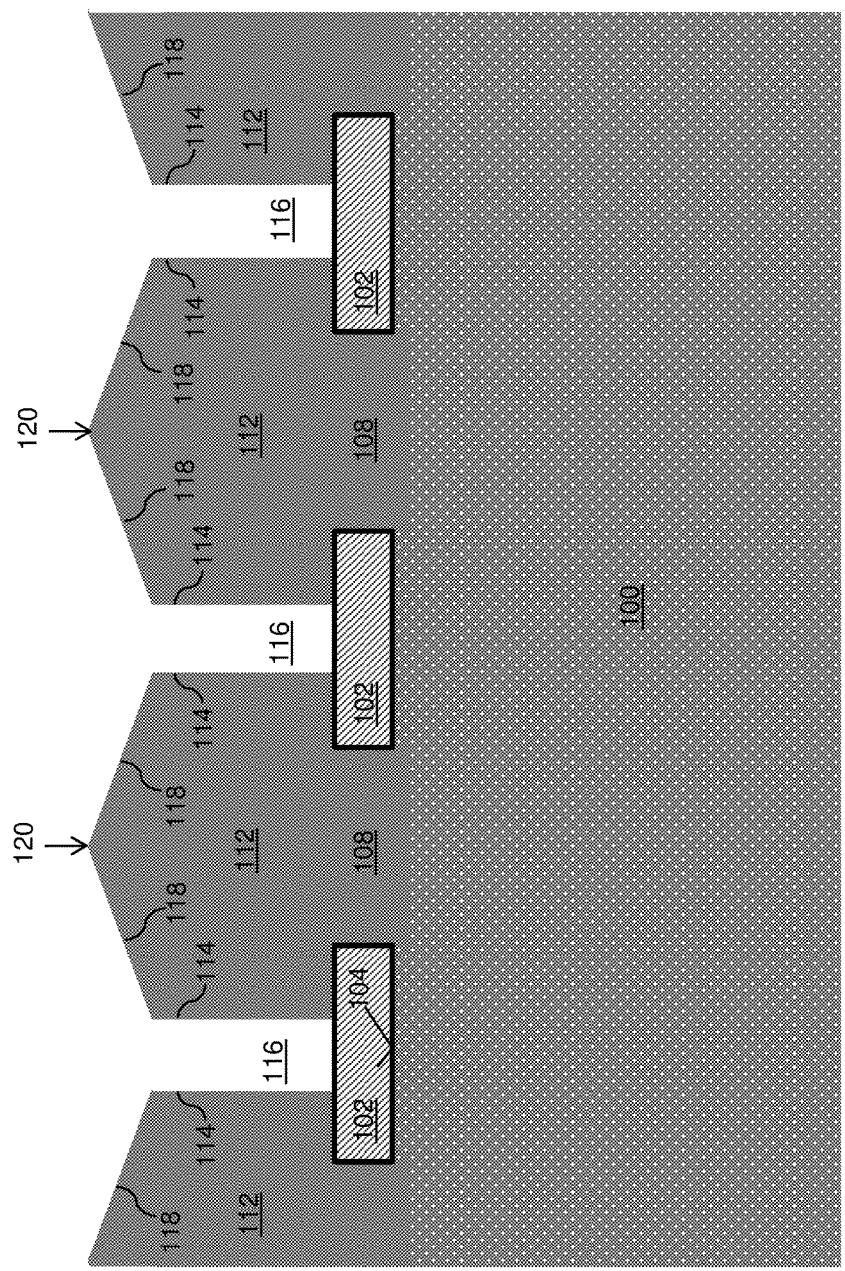
FIG. 4 depicts the arrangement of FIG. 3 after growing an epitaxial layer by an epitaxial lateral overgrowth process to form a gap having opposing sidewalls that defines a trench, according to an embodiment.

Referring to FIG. 4, an epitaxial layer 112 is grown. The epitaxial layer 112 is grown by an epitaxial lateral overgrowth process wherein the first openings 108 are filled by the epitaxial layer 112 and the epitaxial layer 112 grows onto adjacent portions of the first dielectric layer 102 so that part of the first dielectric layer 102 is uncovered by the epitaxial layer 112. A gap forms between opposing sidewalls 114 of the epitaxial layer 112 over the part of the first dielectric layer 102 that is uncovered by the epitaxial layer 112. The gap defines a first trench 116 in the epitaxial layer 112 that extends to the first dielectric layer 102.

The epitaxial lateral overgrowth process depicted in FIG. 4 refers to a process in which the correlation between the growth rate of the epitaxial layer 112 in a vertical direction that is perpendicular to the first surface 104 and the growth rate of the epitaxial layer 112 in a lateral direction that is parallel to the first surface 104 is utilized to control the width between a gap in the epitaxial layer 112. The gap is caused by regions of the first dielectric layer 102 arranged on the first surface 104 that initially limit the formation of the epitaxial layer 112 to the exposed semiconductor material in the first openings 108. In other words, the epitaxial layer 112 can only begin growing on the semiconductor substrate 100 in the first openings 108. Once the epitaxial layer 112 fills the openings 108, it expands over the adjacent portions of the first dielectric layer 102 in the lateral direction while simultaneously expanding the vertical direction. The growth of the epitaxial layer 112 is controlled so that the epitaxial layer 112 does not merge completely and form a continuous surface over the first dielectric layer 102.

The epitaxial lateral overgrowth process may consist of a number of epitaxial cycles, which may be referred to as growth cycles. During each growth cycle, thin crystalline layers are deposited on top of one another, using the immediately subjacent material as a template for the growth of a crystal structure. The thickness of the epitaxial layer 112 is controlled by the number of growth cycles. As each growth cycles results in near-perfect replication of thin layers of crystal structure having a well-defined thickness, the expansion rate of the epitaxial layer 112 is precise and controllable. Consequently, the width between a gap in the epitaxial layer, which defines a width of the first trench 116, is precise and highly controllable. As opposed to trench formation techniques involving lithography (e.g. masking and etching), the width of the first trench 116 is not dependent upon the maximum resolution of the lithography. Instead, the number of growth cycles and consequently the thickness of the epitaxial layer 112 may be used to control the width of the first trench 116. Other parameters that may be adjusted to control the dimensions of the first trench 116 include the pitch of the first openings 108 in the first dielectric layer 102, the width of the first openings 108 and the width of the portions of the first dielectric layer 102 between adjacent ones of the of first openings 108, to name a few.

As shown in FIG. 4, the opposing sidewalls 114 in the epitaxial layer 112 are substantially perpendicular to the first surface 104. According to other embodiments (not-shown) the opposing sidewalls 114 in the epitaxial layer 112 may be non-perpendicular with respect to the first surface 104. That is, tapered sidewalls 114 may be formed. This may be achieved by tuning the growth parameters of the epitaxial deposition process.

The epitaxial lateral overgrowth process described herein may be used to produce atomically flat surfaces. As used herein, an atomically flat surface is a surface that extends substantially along a natural crystalline plane of a material, such as the 1-0-0 crystalline plane of a silicon crystal material. Accordingly, the epitaxial lateral overgrowth process may be utilized to produce a trench 116 wherein the opposing sidewalls 114 comprise an atomically flat surface. Conventional lithography techniques do not reliably produce atomically flat surfaces because the etching process does not remove material precisely along a natural crystalline plane. Conventional lithography techniques at best produce optically flat surfaces. An optically flat surface may appear to be substantially flat upon visual inspection (e.g. by a scanning electron microscope), but is multi-faceted on an atomic level. That is, in contrast to an atomically flat surface, an optically flat surface extends along includes different crystalline planes (e.g. 1-0-0, 1-0-1) that are adjacent to one another.

Thus, epitaxial lateral overgrowth may be used to produce a trench 116 that has smoother sidewalls 114 than what would otherwise be possible using lithography. Smoother sidewall 114 surfaces reduce electrical leakage currents and lower numbers of electrically active traps for charge carriers at the interface of the epitaxial layer 112 silicon and adjacent dielectric layers. Further, narrower trenches 116 that what would otherwise be possible using lithography may be produced by epitaxial lateral overgrowth because the sidewalls 114 do not deviate towards one another at any point.

As shown in FIG. 4, the epitaxial layer 112 may be grown such that an outer surface 118 of the epitaxial layer 112 between adjacent ones of the first trenches 116 is inclined with respect to the first surface 104. That is, if the trench sidewalls 114 are perpendicular to the first surface 104, the outer surface 118 extends away from one of the trench sidewalls 114 at an inclined angle (i.e. greater than 90 degrees). Further, the outer surface 118 may include an apex 120 where the epitaxial layer 112 is maximally spaced apart from the semiconductor substrate 100. Optionally, the apex 120 may be removed by an etching or polishing step so that the outer surface 118 includes a portion that is substantially parallel with the first surface 104.

FIGS. 5-8 depict an exemplary method of using the first trenches 116 formed in the epitaxial layer 112 according to the method of FIGS. 1-4 to form semiconductor devices in the epitaxial layer 112.

Referring to FIG. 5A, a second dielectric layer 122 is formed. The second dielectric layer 122 is formed along the opposing sidewalls 114 in the first trench. The second dielectric layer may 122 be formed as an oxide layer using a commonly known oxidation processes. For instance, in the event that the epitaxial layer 112 is a silicon material, the second dielectric layer may 122 be formed by an oven oxidation process. Optionally, the second dielectric layer 122 may be a continuous layer that covers the outer surface 118.

Figure 5B:
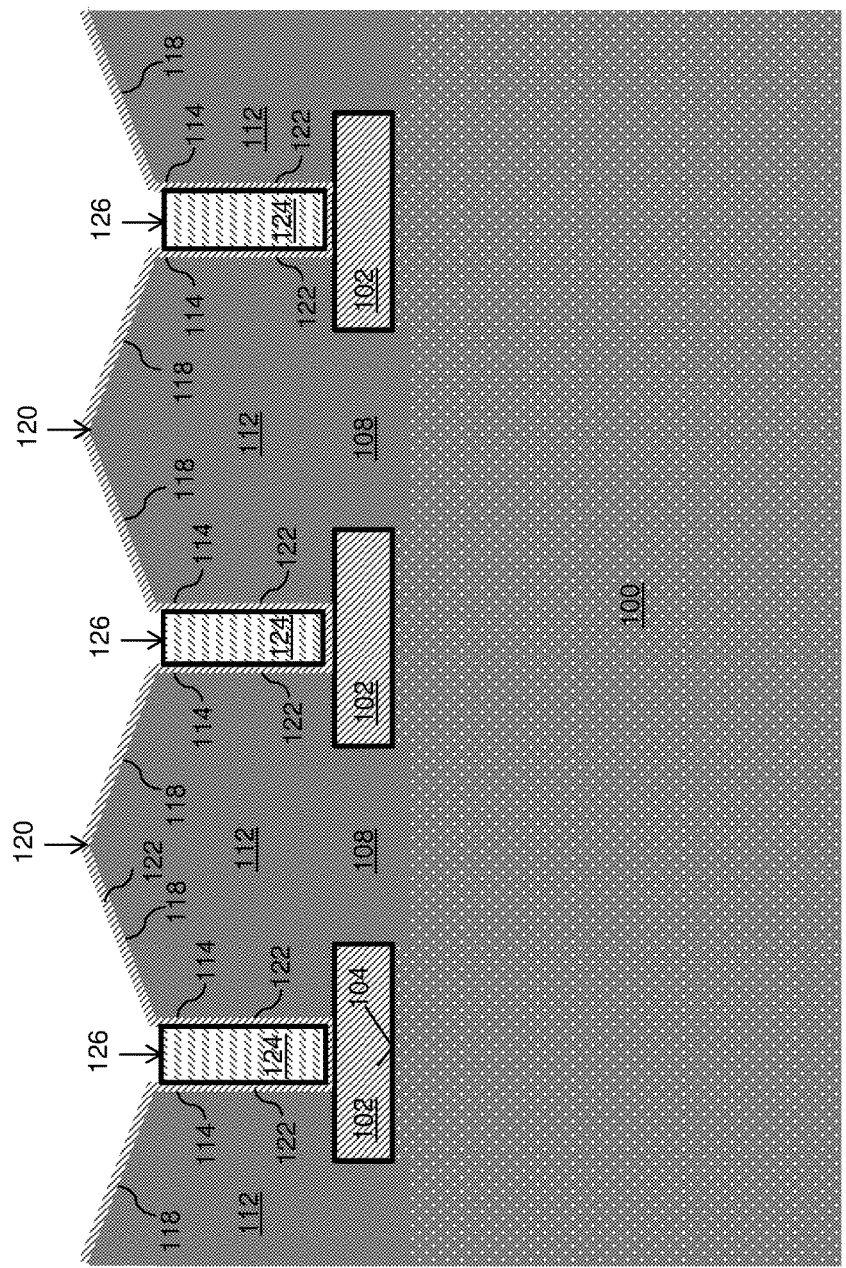

Referring to FIG. 5B, a conductive electrode 124 is formed in the first trench 116. The conductive electrode 124 is formed such that the first and second dielectric layers 102, 122 electrically insulate the conductive electrode 124 from the semiconductor substrate 100 and the epitaxial layer 112. That is, the second dielectric layer is 122 arranged between the conductive electrode 124 and the opposing sidewalls 114 and electrically insulates the conductive electrode 124 from the epitaxial layer 112. The first dielectric layer 102 is arranged between the conductive electrode 124 and the semiconductor substrate 100 and electrically insulates the conductive electrode 124 from the semiconductor substrate 100. The conductive electrode 124 may be formed by depositing polysilicon in the first trench 116 after the formation of the second dielectric layer 122. Optionally, a back etching step may be performed on the conductive electrode 124 such that a top 126 of the conductive electrode 124 is arranged below the outer surface 118 of the epitaxial layer 112.

Figure 6A:
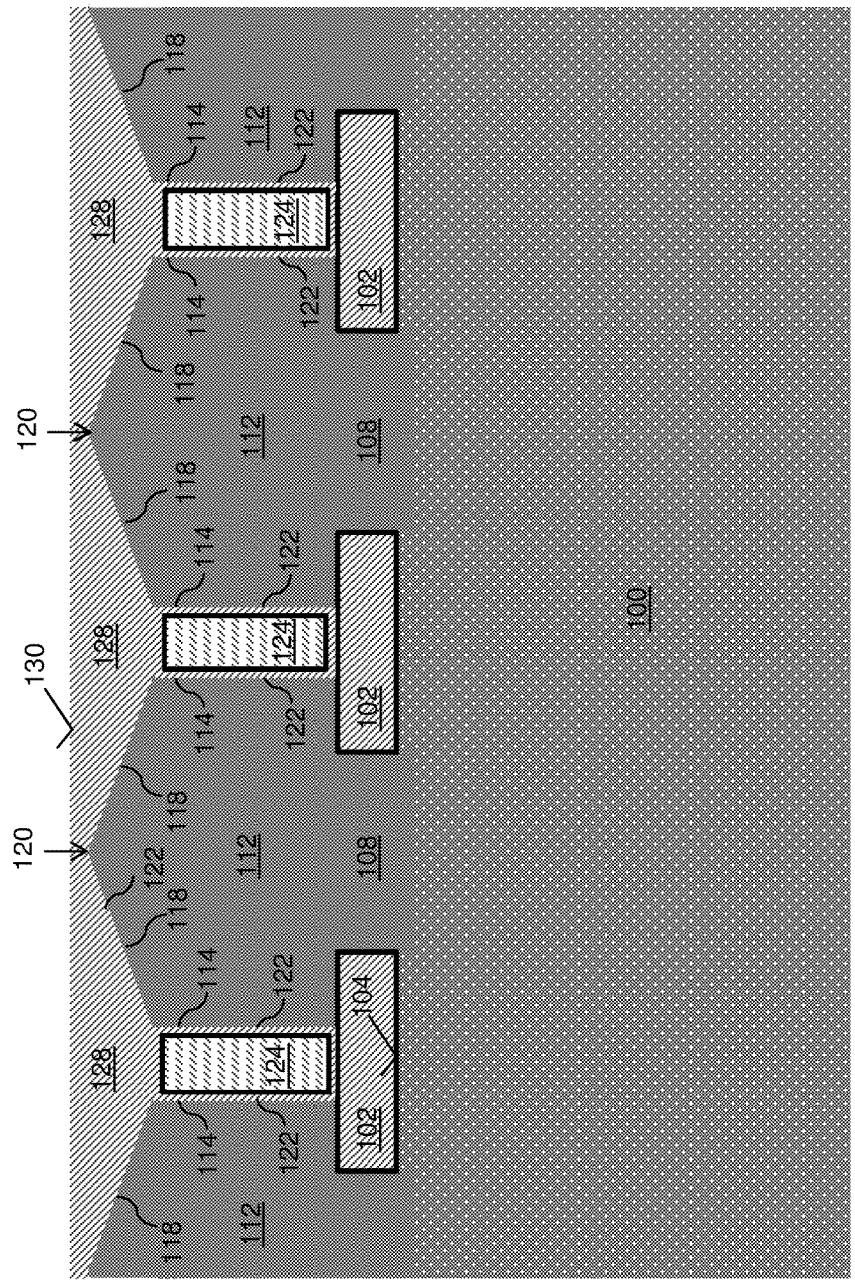
FIGS. 6A-6B depict forming a third dielectric layer over the conductive electrode and over an apex in the outer surface of the epitaxial layer adjacent the trench and thinning the third dielectric layer to expose the apex and surrounding portions of the epitaxial layer, according to an embodiment.
Figure 6B:
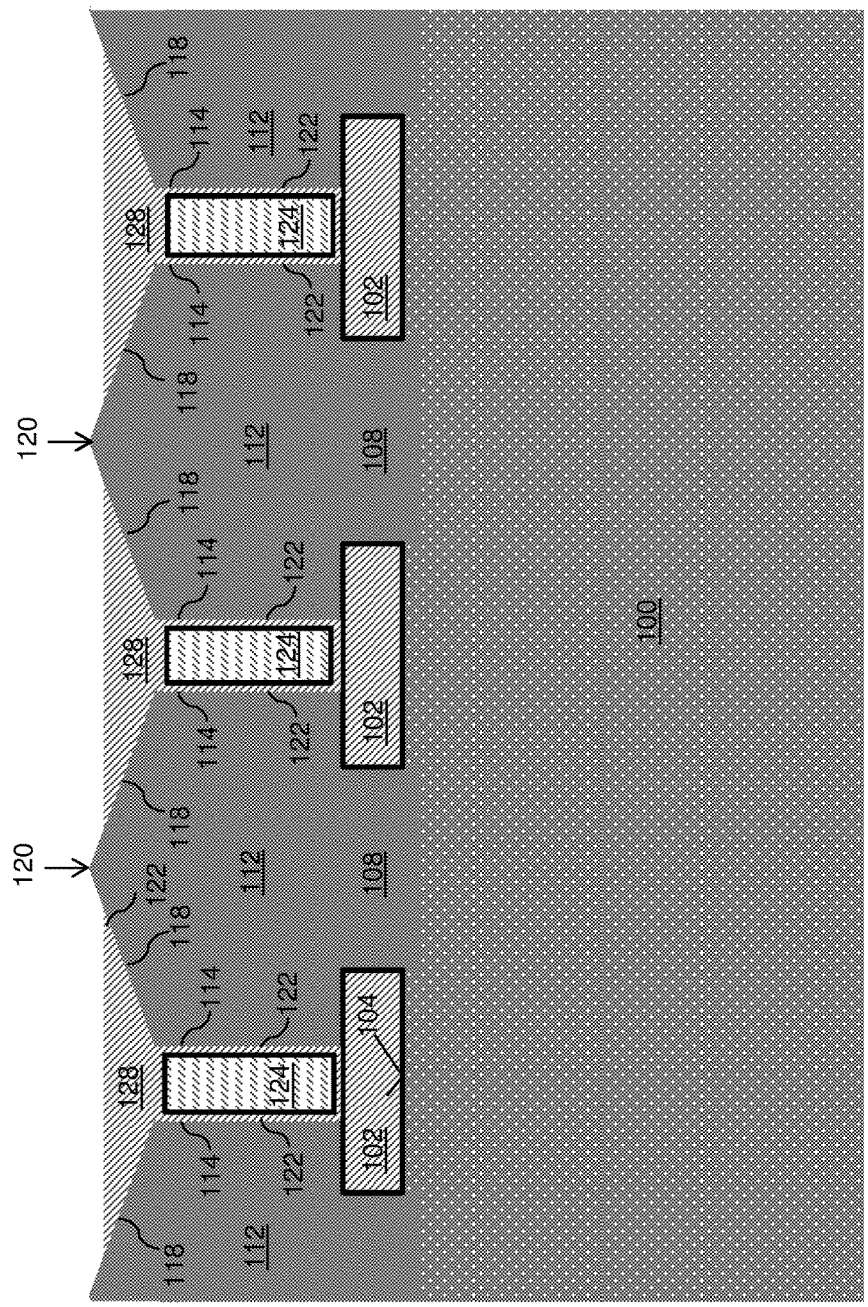

Referring to FIG. 6, a third dielectric layer 128 is formed. The third dielectric layer 128 may be formed by an oxide deposition process in which silicon dioxide is initially grown in the trenches 116 over the top 126 of the conductive electrode 124. As shown in FIG. 6A, the third dielectric layer 128 may be thickened to form a planar dielectric surface 130 that extends over the entire epitaxial layer 112 and covers the apex 120 between adjacent ones of the first trenches 116. The third dielectric layer 128 may be thickened by a sequential deposition process. After thickening, the third dielectric layer 128 may be thinned to expose the apex 120 and surrounding portions of the epitaxial layer 112. The third dielectric layer 128 may be thinned by a chemical mechanical polishing (CMP) process or by an etching process, for example. The resulting arrangement is shown in FIG. 6B.

Figure 7:
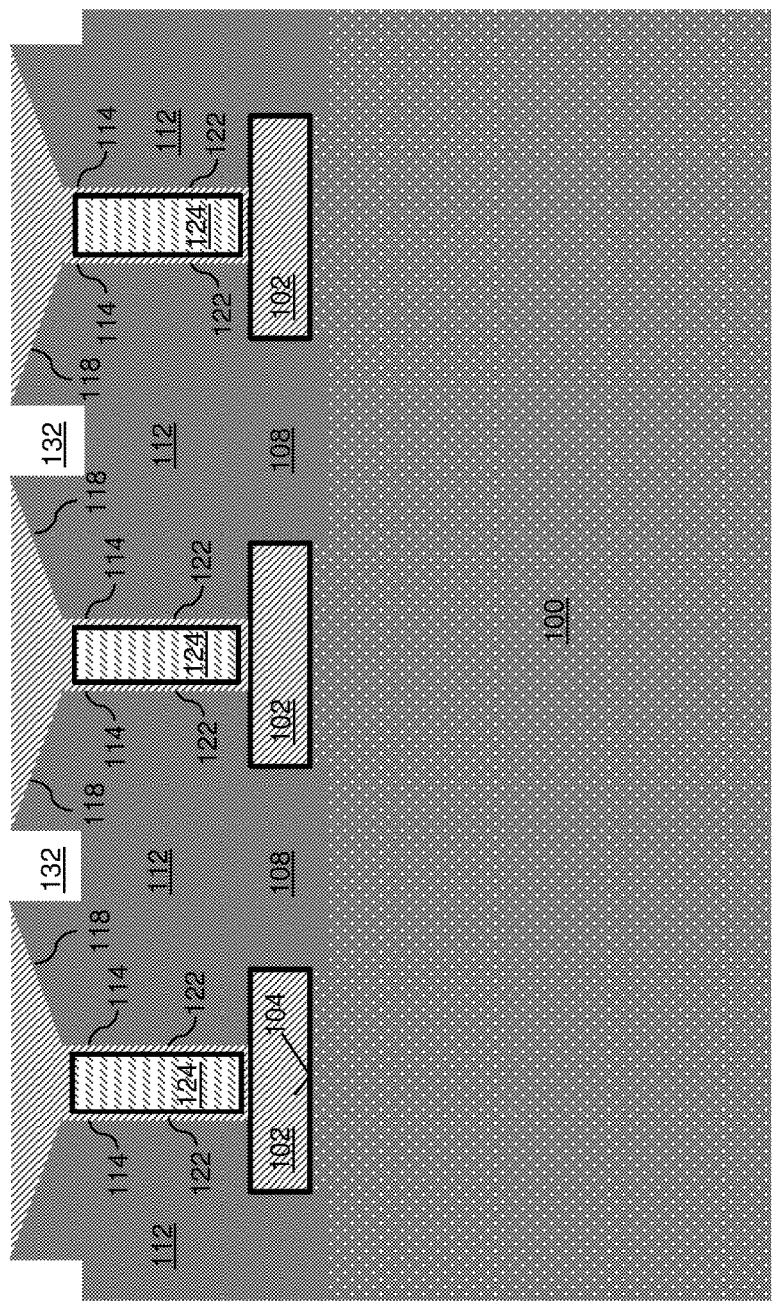
FIG. 7 depicts etching the exposed portions of the epitaxial layer to form a second trench, according to an embodiment.

Referring to FIG. 7, a second trench 132 is formed in the epitaxial layer 112. The second trench 132 is spaced apart from the first trench 116. According to an embodiment, the second trench 132 is formed by etching the exposed apex 120 and surrounding exposed portions of the epitaxial layer 112. A selective etch process may be performed in which silicon material from the epitaxial layer 112 is removed selective to oxide material of the third dielectric layer 128. Thus, the width of silicon that is exposed from the third dielectric layer 128 may be used to determine the width of the second trench 132.

Figure 8:
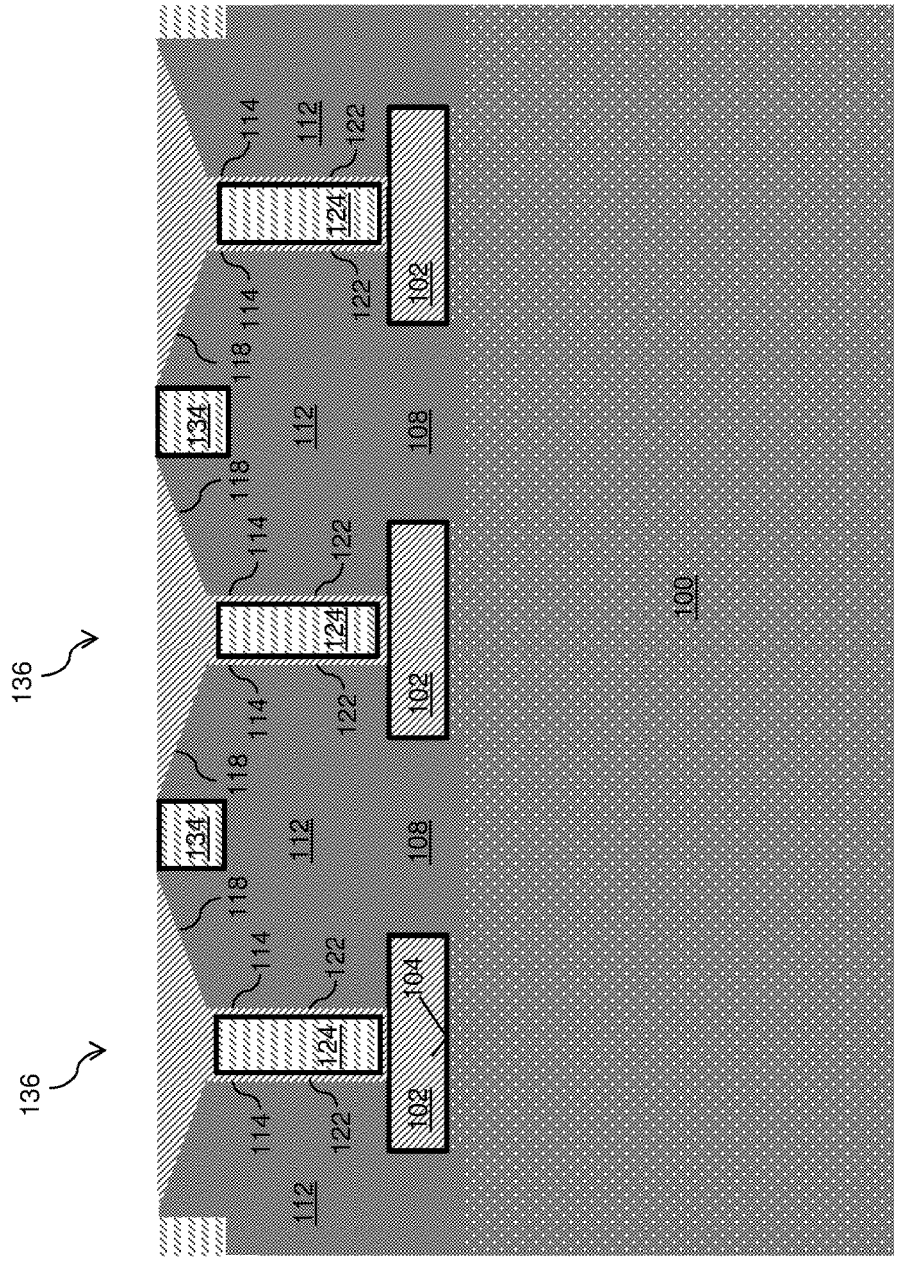
FIG. 8 depicts forming a conductive electrode in the second trench, according to an embodiment.

Referring to FIG. 8, a conductive electrode 134 may be formed in the second trench 132. The conductive electrode 134 may be formed by growing a conductive material, such as polysilicon in the second trench 132 according to commonly known methods. Other conductors, such as Tungsten (W), Aluminum (Al) or Copper (Cu) may be used to form the conductive electrode 134 as well.

A semiconductor device 136 may be provided from the sequence disclosed in FIGS. 1-8. The semiconductor device 136 includes a semiconductor substrate 100 having a first surface 104. A first dielectric layer 102 is arranged on the first surface 104 and includes first openings 108. An epitaxial layer 112 fills the first openings 108 and extends onto adjacent portions of the first dielectric layer 102 so that part of the first dielectric layer 102 is uncovered by the epitaxial layer 112 and a gap between opposing sidewalls 114 of the epitaxial layer is over the part of the first dielectric layer 102 that is uncovered by the epitaxial layer 112. The gap defines a first trench 116 in the epitaxial layer 112 that extends to the dielectric layer. The semiconductor device 136 may include a second trench 132 arranged in the epitaxial layer 112 adjacent the first trench 116 and extending towards the first surface 104. An outer surface 118 of the epitaxial layer 112 extending from one of the sidewalls 114 to the second trench 132 is inclined with respect to the first surface 104. A first conductive electrode 124 is arranged in the first trench 116 and a second conductive electrode 134 is arranged in the second trench 132. A trench dielectric is arranged in the first trench 116 and electrically insulates the first conductive electrode 124 from the epitaxial layer 112. The trench dielectric may be collectively formed from the second and third dielectric layers 122, 128. In the cross-sectional view of FIGS. 7-8, the trench dielectric completely surrounds the first conductor. The first conductive electrode 124 may be electrically contacted by an opening in the trench dielectric in other cross-sectional views not shown. Optionally, the trench dielectric may extend outside of the first trench 116 along the outer surface 118 to the second trench 132.

The semiconductor device 136 may be configured as a MOSFET device. The first conductive electrode 124 and the second conductive electrode 134 may form a gate electrode and a source contact of the MOSFET device, respectively. Alternatively, the first trench 116 may be used to provide a source contact trench and the second trench 132 may be used to form a gate electrode trench of a MOSFET device. Source, body and drain regions (not shown) may be formed according to commonly known methods. The MOSFET may be configured as vertical or lateral current-flow device. For example, in the case of a vertical device, a source region having first conductivity type dopants may be formed in the epitaxial layer 112 at the outer surface 118, by implantation or deposition processes. A drain region may be formed on an opposite side of the semiconductor substrate 100. The first conductive electrode 124 may be configured as a gate electrode to provide a conductive channel in the body region, allowing current to flow between appropriately biased source and drain regions. The second conductive electrode 134 may be configured as a source contact to electrically contact the source region via the second trench 132. Optionally, the second conductive electrode 134 may be arranged in the second trench 132 so that it electrically contacts the body region to provide a body contact of the MOSFET device.

Advantageously, the semiconductor device 136 that is formed according to the presently disclosed method includes portions of the first dielectric layer 102 arranged underneath the first trench 116. These portions of the first dielectric layer 102 are the regions used to provide a gap in the epitaxial layer 112. That is, these portions of the first dielectric layer 102 are used to form the first trench 116 according to the epitaxial lateral overgrowth process discussed herein. The arrangement of these portions of the first dielectric layer 102 may provide beneficial device characteristics. In certain high-voltage applications, substantial electric fields may develop across a MOSFET device, and in particular near the bottom of the gate electrode trench. If these electric fields exceed a critical value of the semiconductor material, avalanche breakdown may occur, causing failure of the device. The arrangement of the portions of the first dielectric later 102 near the bottom of the first trench 116 (which may be used as a gate electrode trench) mitigates this possibility by dispersing the electric field around the trench bottom. Other configurations that may be provided to address this issue include a dual-poly design in which the gate electrode consists of two different polysilicon portions. A polysilicon portion at the bottom of the trench has a different conductivity than a portion at the top of the trench. Advantageously, the presently disclosed trench structure eliminates or mitigates the need for a dual-poly design and thus offers a simpler, more cost-effective solution.

The methods of FIGS. 1-8 may be used to provide a semiconductor device 136 having a gate electrode trench that is self-aligned with the contact trench. This self-alignment is attributable to the fact that the arrangement of the first and second trenches 116, 132, as described above, are both dependent upon a single opening 108 formed in the first dielectric layer 102. The first trench 116 must form over the first dielectric layer 102 at a predictable spacing from the first opening 108 because the epitaxial layer 112 is grown out of the first opening 108. The location of the second trench 132 is dependent upon the location of the apex 120 due to the thickening and thinning of the third dielectric layer 128 to expose the apex 120, as described above with respect to FIG. 7. The apex 120 is at or near a lateral center of the first opening 108 due to the growth direction of the epitaxial layer 112. Thus, the lateral alignment of both the gate electrode trench and the contact trench is controlled by the single process step of forming the first openings 108 in the first dielectric layer 102. Advantageously, this eliminates the variability and reduced yield associated with conventional processes in which a gate electrode trench and a source contact trench are formed by separate masking and etching steps.

Figure 9:
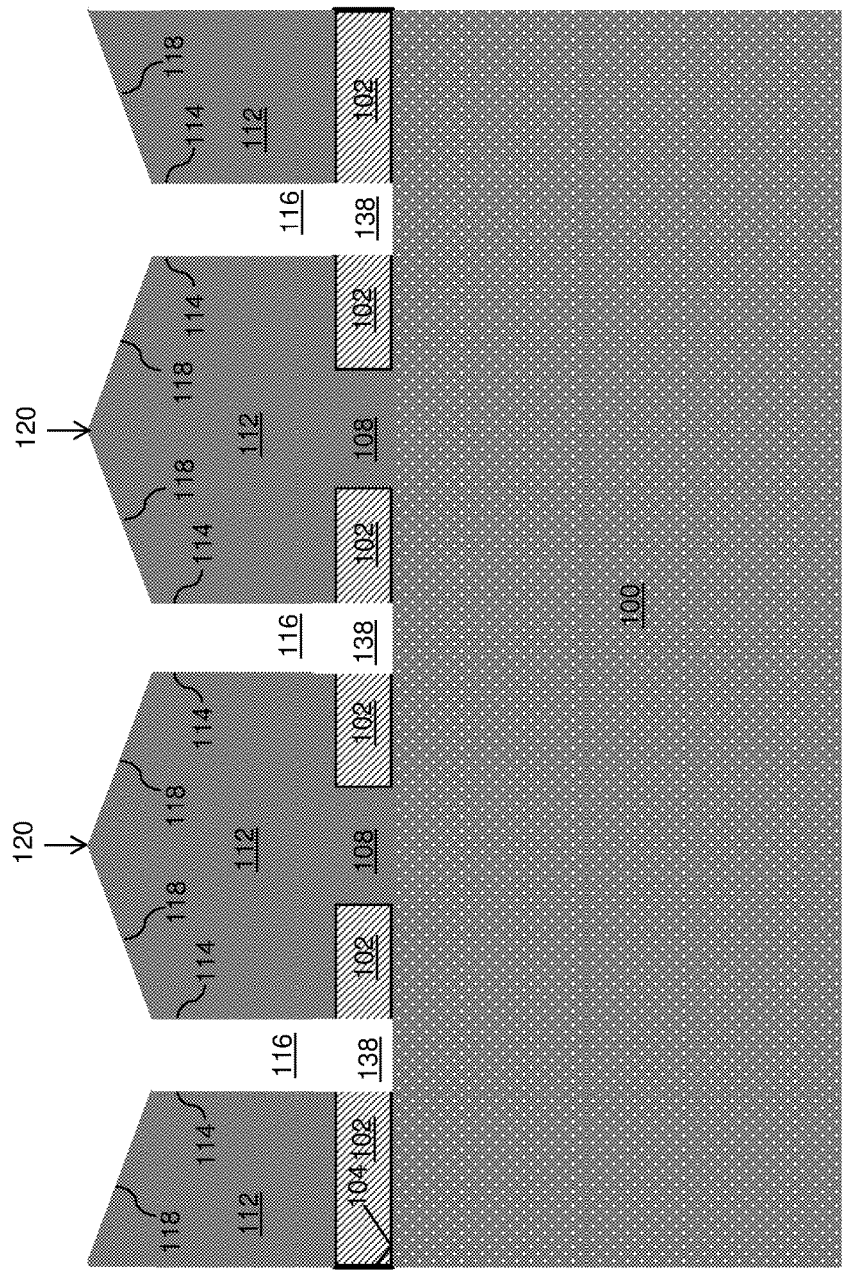
FIG. 9 depicts the arrangement of FIG. 4 after forming second openings in the first dielectric layer aligned with the gap in the epitaxial layer, according to an embodiment.
Figure 10:
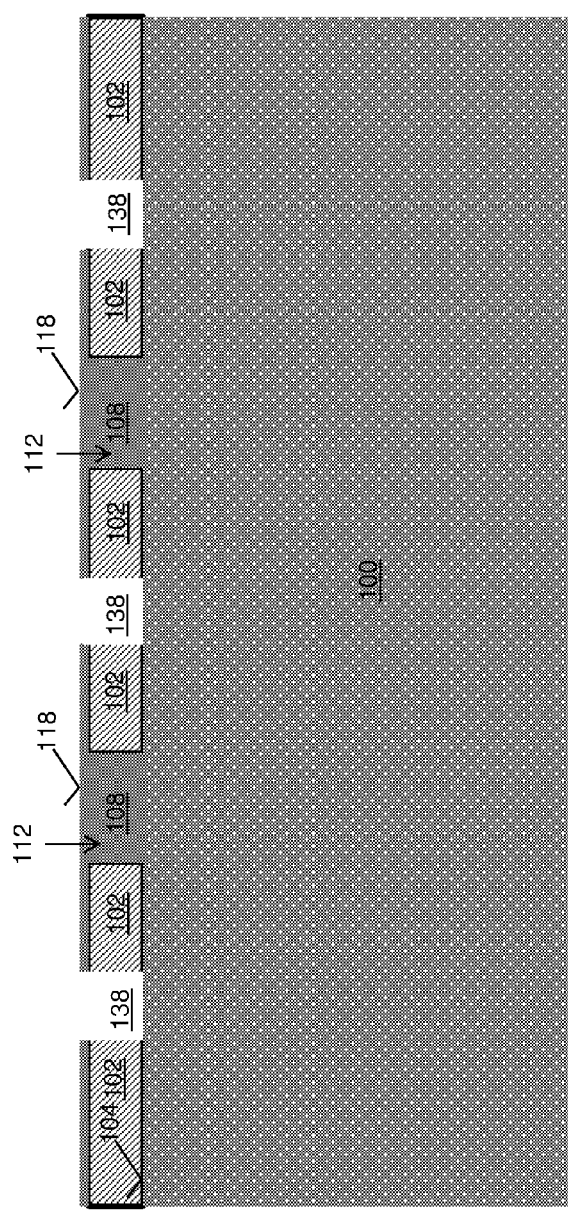
FIG. 10 depicts removing a portion of the epitaxial layer from the arrangement of FIG. 9, according to an embodiment.
Figure 11:
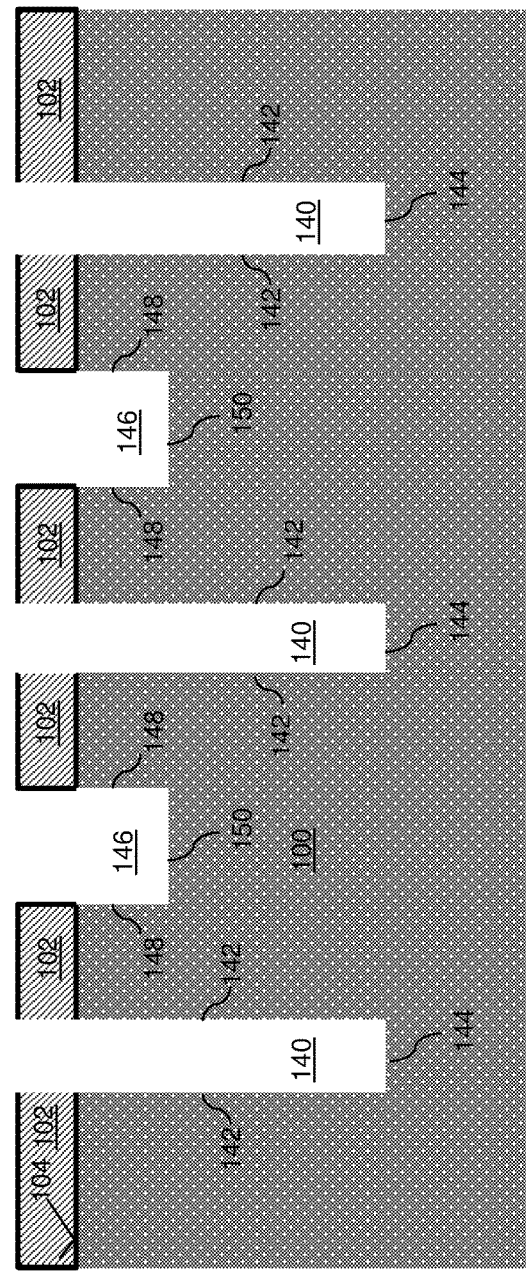
FIG. 11 depicts forming third and fourth trenches in the semiconductor substrate by an etching process wherein the third and fourth trenches align with the first and second openings in the first dielectric layer, according to an embodiment.

FIGS. 9-11 depict an embodiment of the presently disclosed method in which the first trenches 116 in the epitaxial layer 112 formed according to the methods disclosed in FIGS. 1-5 are used to form deep vertical trenches in the semiconductor substrate 100. These deep vertical trenches may be used to form semiconductor devices in the semiconductor substrate 100.

Referring to FIG. 9, after growing the epitaxial layer 112, second openings 138 are formed in the first dielectric layer 102. The second openings 138 are aligned with the gap in the epitaxial layer 112 and extend through the first dielectric layer 102 to the semiconductor substrate 100 so as to expose portions of the semiconductor substrate 100 under the second openings 138. The second openings 138 may be formed by an etching process. The etching process may be a selective etching process in which exposed silicon dioxide in the first trenches 116 is etched selective to epitaxially grown silicon of the epitaxial layer 112, for example.

Referring to FIG. 10, the epitaxial layer 112 is partially removed. The epitaxial layer 112 may be removed by a chemical mechanical polishing process, according to commonly used methods. As a result, the outer surface 118 of the remaining epitaxial layer 112 is spaced closer to the first surface 104 and is substantially planar.

Referring to FIG. 11, a third trench 140 is formed by removing semiconductor material from the second openings 138. The third trench 140 has opposing sidewalls 142 and a trench bottom 144 arranged in the semiconductor substrate 100. In other words, the third trench 140 is not a trench in the epitaxial layer 112 but rather is a trench in the original semiconductor substrate 100 from which the epitaxial layer was grown 112. The third trench 140 may be formed by a chemical etch process whereby silicon material is removed from the semiconductor substrate 100 selective to the silicon dioxide of the first dielectric layer 102, for example.

Advantageously, the third trench 140 is formed in such a manner that a minimum width of the third trench 140 is not dependent upon a maximum resolution of a lithography processes. As previously explained, the above described epitaxial lateral overgrowth process allows for the formation of first trenches 116 in the epitaxial layer 112 that are narrower than trenches produced by photolithography. In the method depicted in FIGS. 9-11, the opposing sidewalls 114 of the epitaxial layer 112 forming the first trench 116 are used as etch boundaries for the formation of the second openings 138 in the dielectric layer 102. Thus, the second openings 138 may be formed to be narrower than what would otherwise be possible from a lithography mask. These second openings 138 in turn are used as etch boundaries for the formation the third trench 140 as a deep vertical trench within the semiconductor substrate 100.

Additionally, referring to FIG. 11, a fourth trench 146 may be formed by removing semiconductor material from first openings 108. The fourth trench 146 has opposing sidewalls 148 and a trench bottom 150 arranged in the semiconductor substrate 100. In a similar manner as described above regarding the formation of the third trench 140, the first openings 108 provide an etch boundary for the etching of the fourth trench 146. Advantageously, the third and fourth trenches 140, 146 may be formed at the same time by a single chemical etch process. Additionally, the remaining epitaxial layer 112 shown in FIG. 10 may be removed during this etch process. As will be explained in further detail below, the third and fourth trenches 140, 146 may be configured as gate and contact trenches in a semiconductor device, respectively. Therefore, the above described method advantageously reduces production costs in comparison to processes in which the gate and contact trenches are each formed by separate masking steps.

A further advantage of the above described method is that the third and fourth trenches 140, 146 are self-aligned. As previously explained, the arrangement of the first trench 116 is dependent upon the arrangement of the first opening 108. Furthermore, the arrangement of the second opening 138 is dependent upon the arrangement of the first trench 116. Thus, the first and second openings 108, 138, which are used to form the third and fourth trenches 140, 146, are self-aligned.

A further advantage of the above described method is that a single mask process may be used to form two trenches having different heights. The bottoms 144, 150 of the third and fourth trenches 140, 146 may each be separated from the first surface 104 by a different distance. Referring to FIG. 10, the remaining portion of epitaxial layer 112 filling the first opening 108 provides a buffer over the semiconductor substrate 100. However, this buffer does not exist in the second openings 138, which have been etched so that the semiconductor substrate 100 is exposed. Therefore, once an etching process is performed on the arrangement of FIG. 10, the third trench 140 will begin forming before the fourth trench 146. The fourth trench 146 will begin forming once the etchant removes the remaining epitaxial layer 112 filling the first openings. A thickness of the remaining epitaxial layer 112 filling the first openings may be at or close to a thickness of the first dielectric layer 102, by using a CMP process that stops at the first dielectric layer, for example. Thus, the height difference between the third and fourth trenches 140, 146 may be controlled by controlling the thickness of the first dielectric layer.

A semiconductor device may be formed in the semiconductor substrate according to the sequence disclosed in FIGS. 1-4 and 9-11. The semiconductor device includes a semiconductor substrate having a first surface 104. A deep vertical trench 140 is formed in the semiconductor substrate 100 and includes sidewalls 142 extending from the first surface 104 to a bottom side 144 that is spaced apart from the first surface 104. The trench 140 has a depth that is measured by a distance from the first surface 104 to the bottom side 144 and a width that is measured by a minimum separation distance between the trench sidewalls 142. According to an embodiment, the width of the trench 140 is less than or equal to 100 nanometers. Trench widths such as 50 or 35 nanometers are possible. The trench 140 has an aspect ratio that is determined by a ratio of the length to the width. According to an embodiment, the aspect ratio of the trench 140 is at least 10:1. Optionally, the aspect of the ratio of the trench 140 may be higher than this, such as 20:1.

A MOSFET device may be formed in the semiconductor substrate 100 using the third and fourth trenches 140, 146, for example. A conductive gate electrode may be formed in the third trench 140 in a similar manner as discussed above with reference to the gate electrode formed in the first trench 116 in the embodiment of FIGS. 1-8. Likewise, a conductive source contact may be provided in the fourth trench 146 in the in a similar manner as discussed above with reference to the source contact in the second trench 132 in the embodiment of FIGS. 1-8. Source, body and drain regions may be formed in the semiconductor substrate 100 according to commonly known methods. Alternatively, the third trench 140 may be used to form a source contact trench and the fourth trench 146 may be used to form a gate electrode trench.

FIGS. 1-11 depict cross-sectional views of the semiconductor substrate 100 to illustrate the presently disclosed methods and corresponding trench structures. The cross-sectional perspective of these figures does not necessarily represent every cross-section of the semiconductor substrate 100. For instance, the first dielectric layer 102 may be a continuous layer such that other cross-sectional views (not shown) do not include first openings 108. That is, the first openings 108 may be patterned into the first dielectric layer 102 over a part of the semiconductor substrate 100. Alternatively, the first openings 108 may extend from one side of the semiconductor substrate 100 to another so that the first dielectric layer 102 includes regions that are separated from one another.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a trench in a semiconductor material, the method comprising:
   forming a first dielectric layer on a semiconductor substrate, the first dielectric layer comprising first openings;
   growing an epitaxial layer on the semiconductor substrate by an epitaxial lateral overgrowth process, wherein the first openings are filled by the epitaxial layer and the epitaxial layer grows onto adjacent portions of the first dielectric layer so that part of the first dielectric layer is uncovered by the epitaxial layer and a gap forms between opposing sidewalk of the epitaxial layer over the part of the first dielectric layer that is uncovered by the epitaxial layer, the gap defining a first trench in the epitaxial layer that extends to the first dielectric layer;
   forming a second dielectric layer along the opposing sidewalk of the epitaxial layer; and
   forming a conductive electrode in the first trench such that the first dielectric layer electrically insulates the conductive electrode from the semiconductor substrate and the second dielectric layer electrically insulates the conductive electrode from the epitaxial layer.

2. The method of claim 1, further comprising:
   forming a third dielectric layer over the conductive electrode and over an apex in an outer surface of the epitaxial layer adjacent the first trench;
   thinning the third dielectric layer to expose the apex and surrounding portions of the epitaxial layer; and
   etching the epitaxial layer at the exposed apex and surrounding portions of the epitaxial layer to form a second trench in the epitaxial layer spaced apart from the first trench.

3. The method of claim 1, wherein forming the first dielectric layer comprises:
   oxidizing the semiconductor substrate to form a layer of oxide on a first surface of the semiconductor substrate,
   masking the layer of oxide so that portions of the layer of oxide are unprotected by the mask;
   etching the unprotected portions of the layer of oxide to the first surface of the semiconductor substrate to form the first dielectric layer with the first openings.

4. The method of claim 3, further comprising:
   re-oxidizing the semiconductor substrate to form oxide regions in the first openings; and
   etching the oxide regions such that the first openings extend into the semiconductor substrate beyond the first surface.

5. A method of forming a trench in a semiconductor material, the method comprising:
   oxidizing a semiconductor substrate to form a layer of oxide on a first surface of the semiconductor substrate;
   masking the layer of oxide so that portions of the layer of oxide are unprotected by the mask;
   etching the unprotected portions of the layer of oxide to the first surface of the semiconductor substrate to form a first dielectric layer with first openings; and
   growing an epitaxial layer on the semiconductor substrate by an epitaxial lateral overgrowth process, wherein the first openings are filled by the epitaxial layer and the epitaxial layer grows onto adjacent portions of the first dielectric layer so that part of the first dielectric layer is uncovered by the epitaxial layer and a gap forms between opposing sidewalls of the epitaxial layer over the part of the first dielectric layer that is uncovered by the epitaxial layer, the gap defining a first trench in the epitaxial layer that extends to the first dielectric layer.

6. The method of claim 5, further comprising:
   re-oxidizing the semiconductor substrate to form oxide regions in the first openings; and
   etching the oxide regions such that the first openings extend into the semiconductor substrate beyond the first surface.

7. The method of claim 5, further comprising:
   forming a second dielectric layer along the opposing sidewalls of the epitaxial layer; and
   forming a conductive electrode in the first trench such that the first dielectric layer electrically insulates the conductive electrode from the semiconductor substrate and the second dielectric layer electrically insulates the conductive electrode from the epitaxial layer.

8. The method of claim 7, further comprising:
   forming a third dielectric layer over the conductive electrode and over an apex in an outer surface of the epitaxial layer adjacent the first trench;
   thinning the third dielectric layer to expose the apex and surrounding portions of the epitaxial layer; and
   etching the epitaxial layer at the exposed apex and surrounding portions of the epitaxial layer to form a second trench in the epitaxial layer spaced apart from the first trench.

9. The method of claim 5, further comprising:
   forming second openings in the first dielectric layer after growing the epitaxial layer, the second openings aligned with the gap in the epitaxial layer and extending through the first dielectric layer to the semiconductor substrate so as to expose portions of the semiconductor substrate under the second openings; and etching the exposed portions of the semiconductor substrate under the second openings to form a second trench having opposing sidewalls and a bottom arranged in the semiconductor substrate.

10. The method of claim 9, further comprising:

removing the epitaxial layer filling the first openings in the first dielectric layer so as to expose portions of the semiconductor substrate under the first openings; and etching the semiconductor substrate under the first openings to form a third trench having opposing sidewalk and a trench bottom arranged in the semiconductor substrate.

11. The method of claim 10, wherein the second and third trenches are formed at the same time.

12. The method of claim 11, wherein the second and third trenches are formed by a single etching process.

13. The method of claim 9, wherein the epitaxial lateral overgrowth process comprises a number of epitaxial cycles, wherein a width of the first openings, a width of the dielectric layer between adjacent ones of the first openings and the number of epitaxial cycles are selected such that an aspect ratio of the second trench is at least 10:1, wherein the aspect ratio is a ratio of a depth of the second trench to a width of the second trench.

14. A method of forming a trench in a semiconductor material, the method comprising:

forming a first dielectric layer on a semiconductor substrate, the first dielectric layer comprising first openings;

growing an epitaxial layer on the semiconductor substrate by an epitaxial lateral overgrowth process, wherein the first openings are filled by the epitaxial layer and the epitaxial layer grows onto adjacent portions of the first dielectric layer so that part of the first dielectric layer is uncovered by the epitaxial layer and a gap forms between opposing sidewalk of the epitaxial layer over the part of the first dielectric layer that is uncovered by the epitaxial layer, the gap defining a first trench in the epitaxial layer that extends to the first dielectric layer;

forming second openings in the first dielectric layer after growing the epitaxial layer, the second openings aligned with the gap in the epitaxial layer and extending through the first dielectric layer to the semiconductor substrate so as to expose portions of the semiconductor substrate under the second openings; and etching the exposed portions of the semiconductor substrate under the second openings to form a second trench having opposing sidewalls and a bottom arranged in the semiconductor substrate.

15. The method of claim 14, further comprising:

removing the epitaxial layer filling the first openings in the first dielectric layer so as to expose portions of the semiconductor substrate under the first openings; and etching the semiconductor substrate under the first openings to form a third trench having opposing sidewalls and a trench bottom arranged in the semiconductor substrate.

16. The method of claim 15, wherein the second and third trenches are formed at the same time.

17. The method of claim 16, wherein the second and third trenches are formed by a single etching process.

18. The method of claim 14, wherein the epitaxial lateral overgrowth process comprises a number of epitaxial cycles, wherein a width of the first openings, a width of the dielectric layer between adjacent ones of the first openings and the number of epitaxial cycles are selected such that an aspect ratio of the second trench is at least 10:1, wherein the aspect ratio is a ratio of a depth of the second trench to a width of the second trench.

19. The method of claim 14, wherein forming the first dielectric layer comprises:

oxidizing the semiconductor substrate to form a layer of oxide on a first surface of the semiconductor substrate;

masking the layer of oxide so that portions of the layer of oxide are unprotected by the mask;

etching the unprotected portions of the layer of oxide to the first surface of the semiconductor substrate to form the first dielectric layer with the first openings.

20. The method of claim 19, further comprising:

re-oxidizing the semiconductor substrate to form oxide regions in the first openings; and etching the oxide regions such that the first openings extend into the semiconductor substrate beyond the first surface.

* * * * *

UNITED STATES PATENT AND TRADEMARK OFFICE
CERTIFICATE OF CORRECTION

PATENT NO. : 9,768,273 B2
APPLICATION NO. : 15/187232
DATED : September 19, 2017
INVENTOR(S) : R. Joshi et al.

It is certified that error appears in the above-identified patent and that said Letters Patent is hereby corrected as shown below:

Column 11, Line 53 (Claim 1, Line 12), please change "sidewalk" to -- sidewalls --.
Column 11, Line 58 (Claim 1, Line 17), please change "sidewalk" to -- sidewalls --.
Column 12, Line 10 (Claim 3, Line 4), please change "substrate," to -- substrate; --.
Column 13, Line 14 (Claim 10, Line 6), please change "sidewalk" to -- sidewalls --.
Column 13, Line 40 (Claim 14, Line 12), please change "sidewalk" to -- sidewalls --.

Signed and Sealed this
Ninth Day of January, 2018

Joseph Matal
*Performing the Functions and Duties of the
Under Secretary of Commerce for Intellectual Property and
Director of the United States Patent and Trademark Office*